(12) United States Patent
Hsu et al.

(10) Patent No.: US 8,422,322 B2
(45) Date of Patent: Apr. 16, 2013

(54) SELF-REPAIR INTEGRATED CIRCUIT AND REPAIR METHOD

(75) Inventors: Louis L. C. Hsu, Fishkill, NY (US); Rajiv V. Joshi, Yorktown Heights, NY (US); Zhijian J. Yang, Stormville, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/288,472

(22) Filed: Nov. 3, 2011

(65) Prior Publication Data

US 2012/0051166 A1 Mar. 1, 2012

Related U.S. Application Data

(62) Division of application No. 12/019,240, filed on Jan. 24, 2008, now Pat. No. 8,098,536.

(51) Int. Cl.
*G11C 7/00* (2006.01)
(52) U.S. Cl.
USPC .......................................... 365/200; 365/154
(58) Field of Classification Search .................. 365/200, 365/154
See application file for complete search history.

(56) References Cited

U.S. PATENT DOCUMENTS

| | | |
|---|---|---|
| 4,238,694 A | 12/1980 | Kimerling et al. |
| 4,701,423 A | 10/1987 | Szluk |
| 5,012,306 A | 4/1991 | Tasch, Jr. et al. |
| 5,416,738 A | 5/1995 | Shrivastava |
| 5,546,340 A | 8/1996 | Hu et al. |
| 6,207,989 B1 | 3/2001 | Li et al. |
| 6,385,081 B1 * | 5/2002 | Shiomi ..................... 365/154 |
| 6,576,966 B1 | 6/2003 | Bulucea |
| 6,596,585 B2 | 7/2003 | Kobayashi et al. |
| 6,872,974 B2 | 3/2005 | Andry et al. |
| 6,958,621 B2 | 10/2005 | La Rosa et al. |
| 7,030,498 B2 | 4/2006 | Kakamu et al. |
| 7,289,360 B2 | 10/2007 | Guterman et al. |
| 2002/0186040 A1 | 12/2002 | Ooishi |
| 2004/0228160 A1 | 11/2004 | Chan et al. |
| 2004/0229476 A1 | 11/2004 | Kobayashi et al. |
| 2006/0118863 A1 | 6/2006 | Dolny et al. |
| 2006/0289916 A1 | 12/2006 | Park et al. |
| 2007/0297254 A1 * | 12/2007 | Rosal et al. ............... 365/201 |

OTHER PUBLICATIONS

La Rosa, et al., "Impact of NBTI Induced Statistical Variation to SRAM Cell Stability" IEEE 44th Annual International Reliability Physics Symposium, Mar. 2006; pp. 274-282.

Huang, C., et al. "Temperature Dependence and Post-Stress Recovery of Hot Electron Degradation Effects in Bipolar Transistors" Bipolar Circuits and Technology Meeting. Sep. 1991. pp. 170-173.

European Patent Office. "European Patent Office Search Report," Issued for EP Application No. 09704712.0. Feb. 2012. (6 Pages).

* cited by examiner

*Primary Examiner* — Anthan Tran
(74) *Attorney, Agent, or Firm* — Tutunjian & Bitetto, P.C.; Preston J. Young

(57) ABSTRACT

A method for repairing degraded field effect transistors includes forward biasing PN junctions of one of a source and a drain of a field effect transistor (FET), and a body of the FET. Charge is injected from a substrate to a gate region to neutralize charge in the gate region. The method is applicable to CMOS devices. Repair circuits are disclosed for implementing the repairs.

6 Claims, 15 Drawing Sheets

# SELF-REPAIR INTEGRATED CIRCUIT AND REPAIR METHOD

RELATED APPLICATION INFORMATION

This application is a Divisional application of allowed co-pending U.S. patent application Ser. No. 12/019,240 filed on Jan. 24, 2008, incorporated herein by reference in its entirety.

BACKGROUND

1. Technical Field

The present invention relates to integrated circuits, and more particularly to circuit self-repair to fully or partially recover damaged devices.

2. Description of the Related Art

As complementary metal oxide semiconductor (CMOS) technology generations advance into submicron and nanometer scale, CMOS-device threshold-voltage instability has become a major reliability problem. The threshold voltage (Vt) instability not only reduces the circuit's operation lifetime, but also adversely affects circuit yields. For example, in static random access memory (SRAM) fails occur during burn-in because of corresponding P-type field effect transistor (PFET) threshold degradation. In analog circuits, severe Vt mismatch could result in circuit failure.

It is known that one major cause of the threshold instability of PFETs is due to an effect called negative bias temperature instability (NBTI). NBTI has been widely investigated because it increases PFET threshold voltage and decreases the drive current due to the buildup of positive charge and surface states in the gate dielectric. As gate dielectric thickness is further reduced and new gate materials are employed, NBTI is becoming a more prominent degradation mechanism in PFET devices. Also, NBTI has become the major reliability issue at the circuit-level due to its large duty cycle under a relative bias between gate and drain in a specific waveform during circuit operation. NBTI is also independent of device channel length.

The analogous threshold instability of an N-type field effect transistor (NFET) is positive bias temperature instability (PBTI). Note that compared with NBTI and other device degradation mechanisms like hot electron wear-out effect, PBTI is less significant for traditional gate oxide devices. However, as high-dielectric constant (high-k) materials are introduced as the gate dielectric for advanced technologies, PBTI effects have a greater impact on the circuit and have to be taken into consideration during the course of process development.

Some degraded devices as a result of certain wear-out mechanisms can be recovered. For example, U.S. Pat. No. 4,238,694 discloses a method for recovering selected areas of a radiation damaged semiconductor by a high temperature bake. For NBTI, various methods have been practiced in the industry to minimize its detrimental effect on device performance during fabrication including tuning a thermal anneal time and hydrogen flow.

Device structures have also been used to reduce NBTI. For example, U.S. Pat. No. 7,030,498, titled "Semiconductor Device with Copper Wirings Having Improved Negative Bias Temperature Instability (NBTI)", teaches the use of a diffusion barrier, such as silicon carbide (SiC), to suppress NBTI-induced threshold shifting. In U.S. Pat. No. 7,030,498, a PFET structure is disclosed, which includes a nitrogen-containing silicon oxide and a copper wiring pattern including an underlying barrier layer and a SiC layer covering the copper wiring pattern. This PFET structure attempts to suppress NBTI deterioration. This fix deviates from normal processing steps and requires new material which is not desirable from a cost point of view.

After device fabrication and stresses under NBTI conditions, thermal annealing was observed to partially recover the NBTI degradation. U.S. Pat. No. 6,958,621, entitled, "Method and Circuit for Element Wearout Recovery," proposes a structure and methodology for circuit recovery after NBTI degradation. U.S. Pat. No. 6,958,621 utilizes an annealing effect for NBTI recovery by employing polysilicon heaters adjacent to the gates of critical devices. By powering up the heater, the channel temperature of the critical devices is raised to an annealing level so that the NBTI-induced interface damage can be partially removed. The drawbacks of this method include: (1) a large area is required for accommodating the heater components, (2) a slow thermal repairing process is needed, and (3) a large amount of power is consumed to reach the annealing condition.

SUMMARY

A method for repairing degraded field effect transistors includes forward biasing PN junctions of one of a source and a drain of a field effect transistor (FET), and a body of the FET. Charge is injected from a substrate to a gate region to neutralize charge in the gate region. The method is applicable to CMOS devices. Repair circuits are disclosed for implementing the repairs.

A method for repairing field effect transistors in a memory circuit having an array of memory cells includes, for pull-up P-type devices, switching a ground line from a ground potential to a supply potential; switching on all wordlines in the array; repairing P-type devices on a first side by connecting an n-well of the P-type devices to a voltage less than the supply potential, but greater than the ground potential; activating bitlines on the first side; repairing P-type devices on a second side by connecting the n-well of the P-type devices to the voltage less than the supply potential, but greater than the ground potential; and activating bitlines on the second side.

Another method for repairing field effect transistors in a memory circuit having an array of memory cells includes, for pull-down N-type devices, switching a supply line from a supply potential to a ground potential; switching on all wordlines in the array; repairing N-type devices on a first side by connecting a P-well of the N-type devices to a voltage greater than the ground potential, but less than the supply potential; deactivating bitlines on the first side; repairing N-type devices on a second side by connecting the P-well of the N-type devices to the voltage greater than the ground potential, but less than the supply potential; and deactivating bitlines on the second side.

A memory circuit includes an array of memory cells having a plurality of access transistors controlled and accessed through associated wordlines and bitlines, the array of memory cells including a supply voltage and a ground. A logic circuit is coupled between the array and the supply voltage and the ground such that the array is selectively connected to the supply voltage and the ground in accordance with at least one fix control signal. A fix control circuit is coupled to the logic circuit, the fix control circuit configured to output the at least one fix control signal to enable portions of the array to be connected to at least one of substrate wells, the supply voltage and the ground to repair field effect transistors by charge neutralization.

The logic circuit may be configured to: for pull-up P-type devices, switch a ground line from a ground potential to a supply potential, switch on all the wordlines in the array, repair P-type devices on a first side by connecting an n-well of the P-type devices to a voltage less than the supply potential, but greater than the ground potential, activate bitlines on the first side, repair P-type devices on a second side by connecting the n-well of the P-type devices to the voltage less than the supply potential, but greater than the ground potential, and activate bitlines on the second side. The supply potential is Vdd and the voltage less than the supply potential, but greater than the ground potential is Vdd−Vfw, where Vfw is a forward bias voltage. The fix circuit may include a sensor configured to trigger a fix mode to output the at least one fix control signal when a threshold voltage exceeds a reference level in at least one device to be repaired.

The logic circuit may be configured to: for pull-down N-type devices, switch a supply line from a supply potential to a ground potential, switch on all wordlines in the array, repair N-type devices on a first side by connecting a P-well of the N-type devices to a voltage greater than the ground potential, but less than the supply potential, deactivate bitlines on the first side, repair N-type devices on a second side by connecting the P-well of the N-type devices to the voltage greater than the ground potential, but less than the supply potential, and deactivate bitlines on the second side. The ground potential is Vss and the voltage greater than the ground potential, but less than the supply potential is Vss+Vfw, where Vfw is a forward bias voltage.

Another method for repairing degraded field effect transistors with floating bodies includes biasing a gate of field effect transistors (FET) into an accumulating mode (for P-type transistors, biasing gate to drain and/or source nodes to a positive potential, for N-type transistors, biasing gate to drain and/or source nodes to a negative potential), and accumulating charge in a gate region to neutralize charge in the gate region.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
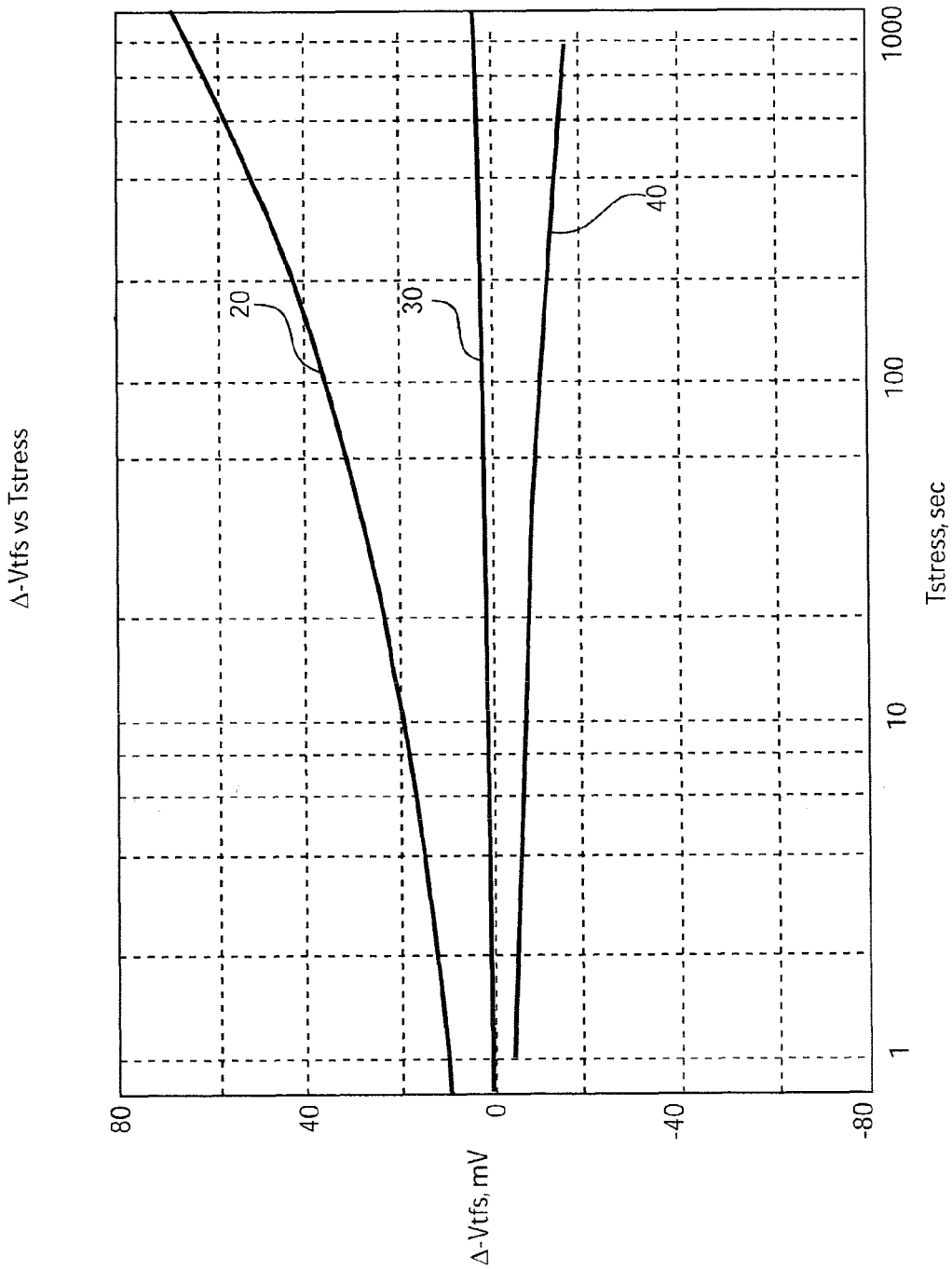
FIG. 1 is a graph of experimental data showing a threshold shift of a PFET device under different bias conditions.

Embodiments in accordance with the present principles provide a recovery method employing electron (or hole) injection, to fully or partially recover device damage caused by negative bias temperature instability (NBTI) or positive bias temperature instability (PBTI). One embodiment applies the repairing method to memory circuits.

A repairing circuit is coupled to a circuit and/or a circuit element sensitive to a NBTI (or PBTI) wearout mechanism and performs damage recovery of the circuit with a damaged device. In one embodiment, a sensing device monitors the NBTI (or PBTI) wearout mechanism, where the sensing device is employed as a failure monitor to call for repairs. The sensing device may also be used as a monitor during the repairs to measure a repairing period.

Although embodiments will be described in terms of memory circuits the present invention is applicable to any number of semiconductor devices and components and should not be construed as limited by the illustrative examples presented herein. For example, the present principles are applicable to transistors or other devices on a processor chip, memory chip, application specific chip, etc.

Embodiments of the present invention can take the form of an entirely hardware embodiment, an entirely software embodiment or an embodiment including both hardware and software elements. In a preferred embodiment, the present invention is implemented in hardware on an integrated circuit device however; the device may run software, be designed in software or have its design tested in software. The software may include but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The circuits described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods described herein may be used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In accordance with the present principles, a recovery mechanism called charge neutralization (herein referred to as CN) may be employed to repair damaged circuit components. Note that most of NBTI degradation is caused by positive charge trapped at a channel/gate dielectric interface under gate bias. If negative electrons can be injected into the affected interface, the trapped positive charge can be neutralized and the threshold shift by the trapped charge can be recovered. There are several ways to inject electrons into a PFET channel for CN recovery. For example, gate tunneling current can be applied for CN recovery. However, this method needs a large voltage drop across gate dielectric and may damage the gate dielectric integrity. Another example employs a channel impact ionization effect, e.g., by stressing a PFET device having a sub-threshold voltage range with a high voltage (e.g., ~1.5 times Vdd) over a drain and a source while biasing a gate below threshold voltage.

Referring now to the drawings in which like numerals represent the same or similar elements and initially to FIG. 1, a plot of threshold voltage change ($\Delta$Vt) in mV versus time or period of stress ($T_{stress}$) in seconds shows the shifts in threshold voltage of a PFET device, with a channel length of 80 nm, as a function of time under a specific bias condition. A threshold shift 20 is under hot-carrier stress with high Vgs (gate to source voltage) and Vds (drain to source voltage) biases, which induce a significant increase in threshold voltage. A shift 30 is under NBTI stress with a high Vgs bias condition, which also causes a slight increase in the threshold voltage (note that the NBTI degradation in this particular technology/process is not significant). A shift 40 is under the impact ionization condition mentioned above, which clearly results in a decrease, or recovery, in the threshold voltage of the PFET device under test.

Another method for employing CN recovery is to inject electrons from an N-well of a PFET device to its source and/or drain junctions by forward biasing these junctions. Under such condition, the electrons from these forward biased PN junctions possess low energies and do not cause any damage to the device. Note that this NBTI recovery by forward biasing N-well/source and/or N-well/drain junctions has been observed by the present inventors.

Figure 2:
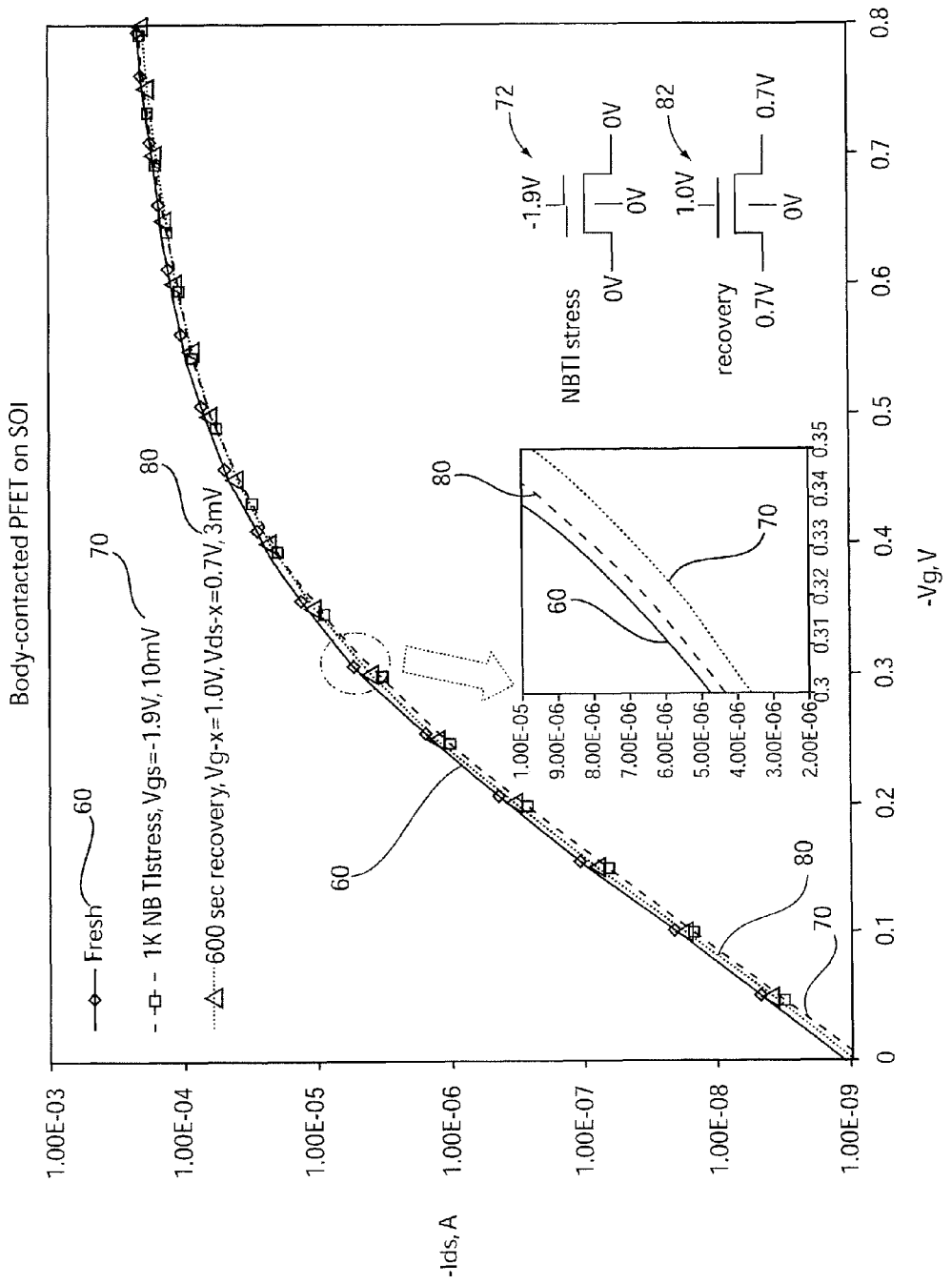
FIG. 2 shows characteristic I-V curves of a PFET device before and after NBTI stress, and after a recovery process, also depicted in the insets are transistors showing relevant voltages in accordance with the present principles.

Referring to FIG. 2, I-V curves 60, 70 and 80 are shown for a body-contacted PFET on a silicon-on-insulator (SOI) substrate. Drain to source current ($I_{DS}$) in Amps is plotted against gate voltage $V_g$ in volts. The I-V curves show the PFET response before stress (as marked by curve 60), after NBTI stress (as marked by curve 70), and after the recovery process (as marked by curve 80). Observe that in curve 70, the 1000 seconds of NBTI stress, with Vgs biased at −1.9V and other nodes grounded as depicted by an inset 72, induces a threshold shift $\Delta$Vt of 10 mV. By employing CN recovery (curve 80) with gate and source/drain biased at +1.0V and +0.7V as depicted by an inset 82, the threshold shift $\Delta$Vt is recovered by 80% to only 2 mV.

Figure 3:
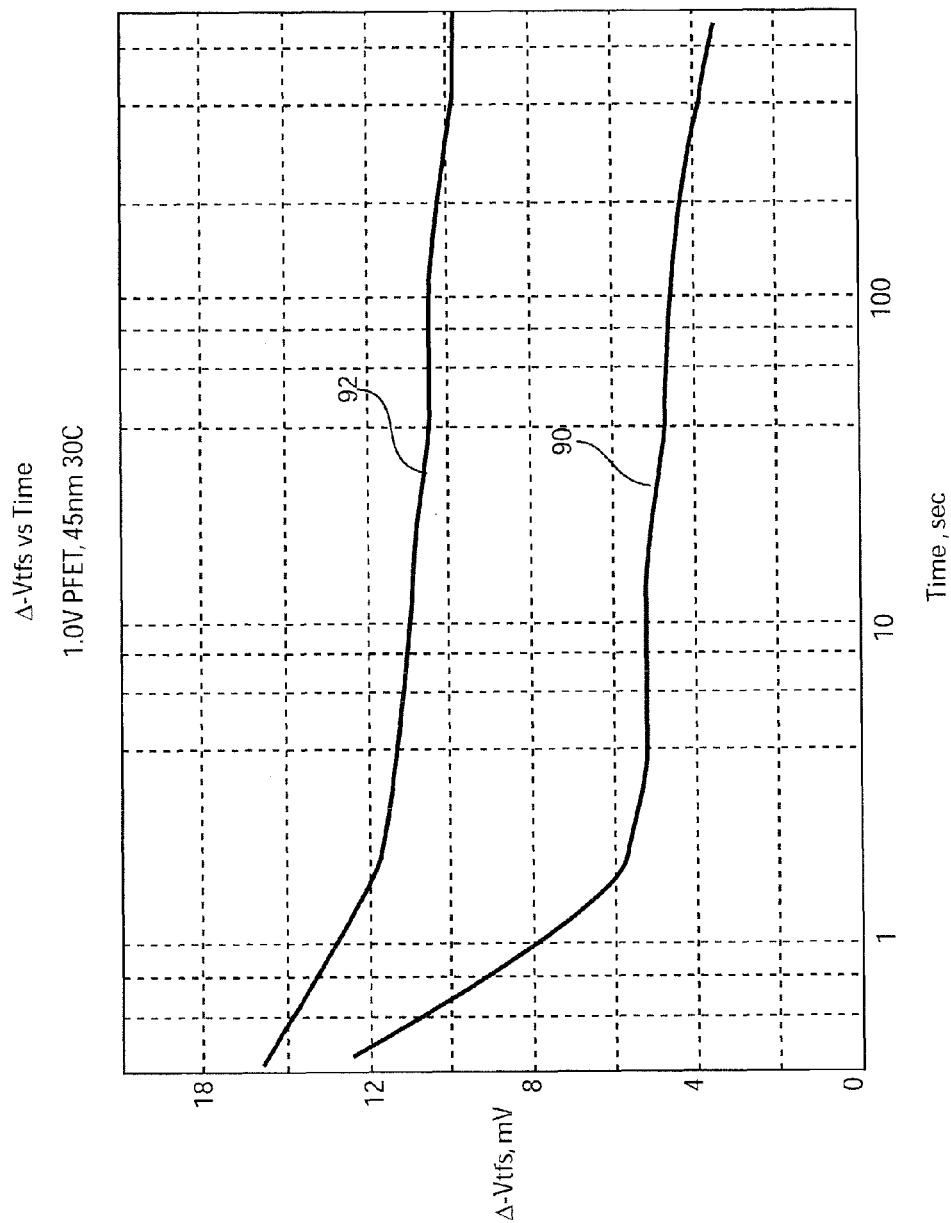
FIG. 3 is a graph of experimental data showing a threshold shift of a PFET device and recovery time behavior, comparing between two bias conditions in a recovery mode.

Referring to FIG. 3, a plot of threshold voltage change ($\Delta$Vt) in mV versus time in seconds for recovery time behavior of a 1.0 Volt PFET, having a channel length of 45 nm at 30 degrees C. is illustratively shown and compares two recovery conditions. A first recovery condition plot 90 includes a 0.8V recovery, and a second recovery condition plot 92 includes a 0.1V recovery.

It can be observed that the recovery at 0.1V under condition plot 92 results in about 25% recovery in threshold shift after one second of bias, which could be attributed to both NBTI self-thermal recovery and the CN effect. Note that the CN effect with condition plot 90 results in as much as 50% threshold recovery within one second, and it also continues to recover during the subsequent bias. Based on these observations, it is clear that many NBTI sensitive devices and circuits can benefit from PN junction recovery effects through CN because CN is damage-free and can be easily implemented in circuit designs.

Figure 4A:
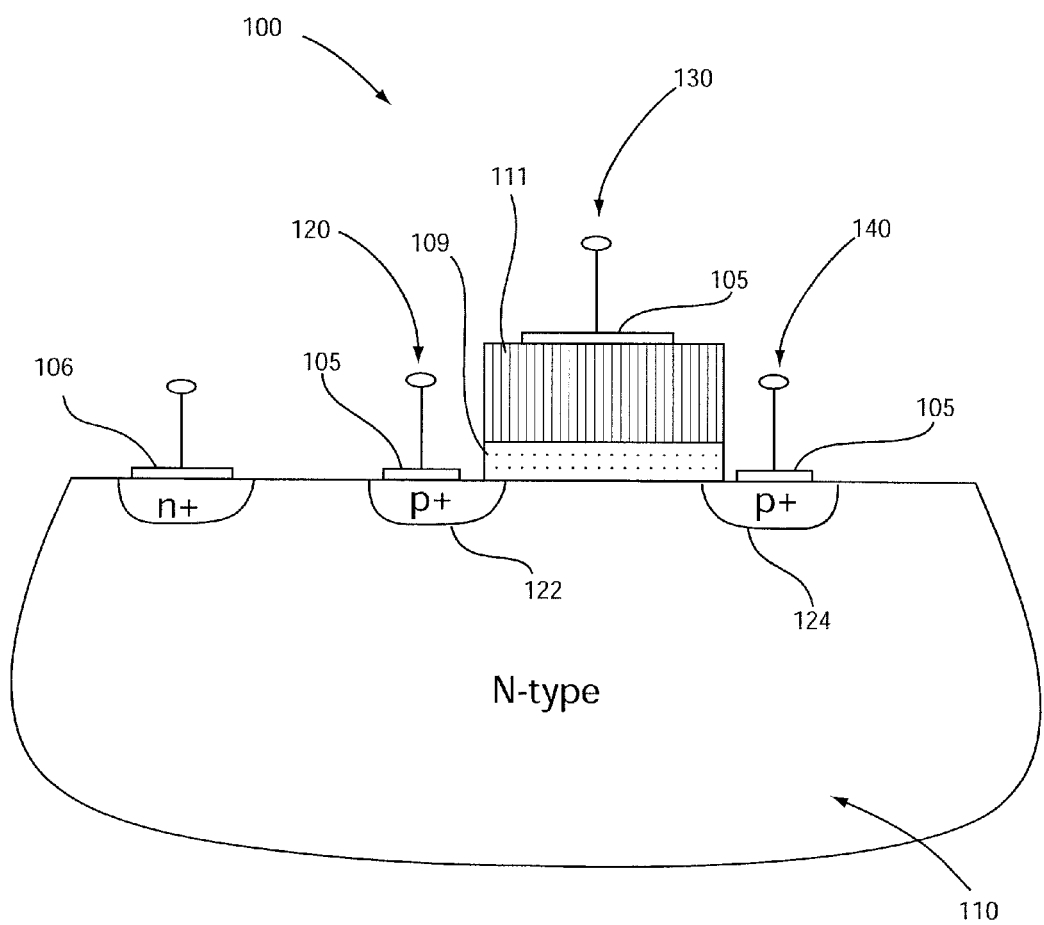
FIG. 4A is a cross-sectional view of a PFET device.

Referring to FIG. 4A, a cross-sectional view illustratively showing a single device recovery embodiment for the recovery of a damaged PFET device 100 is depicted. PFET device 100 includes a gate structure which includes a gate dielectric 109 and a gate conductor 111.

PFET device 100 includes device pads or nodes 105 of a source 120, a drain 140, a gate 130, and a device pad for a body contact 106 of an N-well or substrate 110. A body contact or substrate contact contacts, in this case, the N-well of substrate 110.

During normal device operation, voltages on the N-well node 106 to source node 120 and/or drain node 140 are positively biased, which means that the corresponding N-well 110 and/or p+ junctions 122 and 124 (source and/or drain) are reversely biased.

During a degradation repairing mode in accordance with the present principles, the voltages between N-well pad 106 to source 120, drain 140 and gate 130 are kept negative (e.g., at −0.7V to −0.8V), which results in slight forward biased PN junctions at source 120 and drain 140. This permits electron injection from N-well 110 into source 120 and/or drain 140 regions which neutralizes trapped positive charge caused by NBTI effects.

For a PBTI degraded NFET, a similar method can be applied. The NFET includes polarities of the opposite type depicted in FIG. 4B. To address PBTI effects, simply change bias voltage polarities, e.g., forward bias the NFET P-well/drain and/or p-well/source junctions by applying positive voltage on the p-well.

Figure 4B:
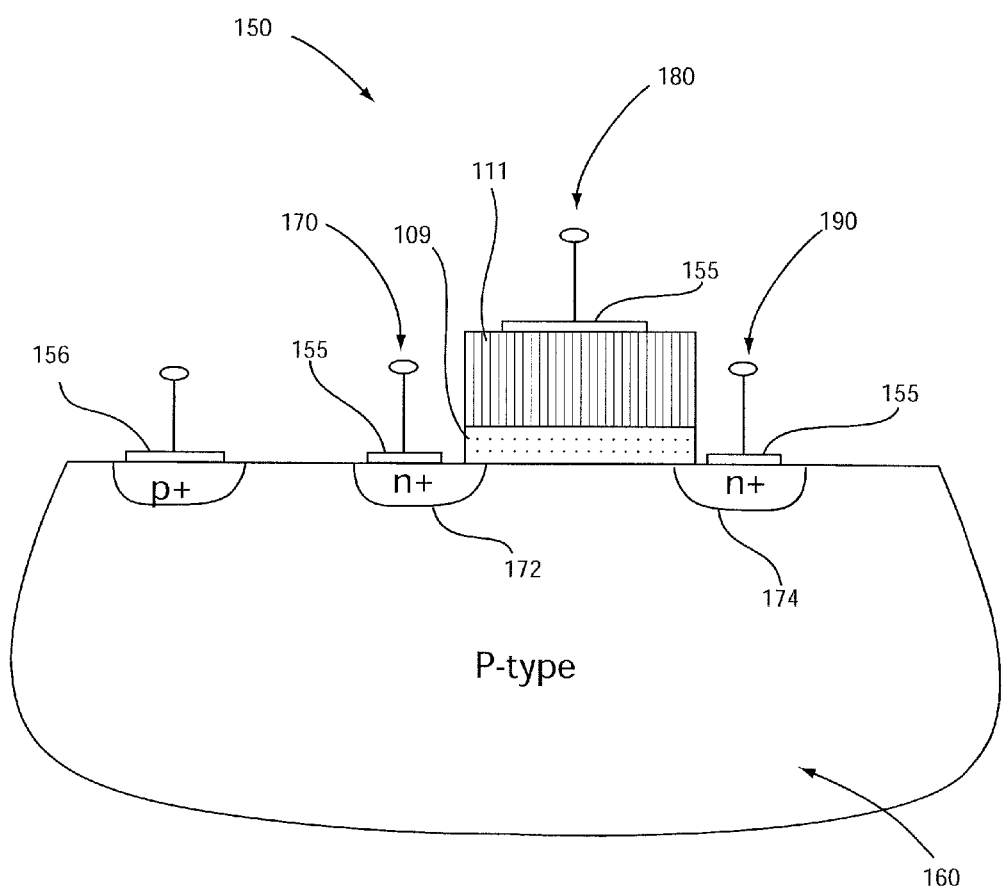
FIG. 4B is a cross-sectional view of an NFET device.

Referring to FIG. 4B, a cross-sectional view illustratively showing a single device recovery embodiment for the recovery of a damaged NFET device 150 is depicted. NFET device 150 includes a gate structure which includes a gate dielectric 109 and a gate conductor 111.

NFET device 150 includes device pads or nodes 155 of a source 170, a drain 190, a gate 180, and a device pad for a body contact 156 of a P-well or substrate 160. A body contact or substrate contact contacts, in this case, the P-well of substrate 160.

During normal device operation, voltages on the P-well node 156 to source node 170 and/or drain node 190 are biased, which may mean that the corresponding P-well 160 and/or n+ junctions 172 and 174 (source and/or drain) are reversely biased.

During a degradation repairing mode in accordance with the present principles, the voltages between P-well pad 156 to source 170, drain 190 and gate 180 are kept positive, which results in slight forward biased PN junctions at source 170 and drain 190. This permits hole injection from P-well 160 into source 170 and/or drain 190 regions which neutralizes trapped negative charge caused by PBTI effects.

Figure 5:
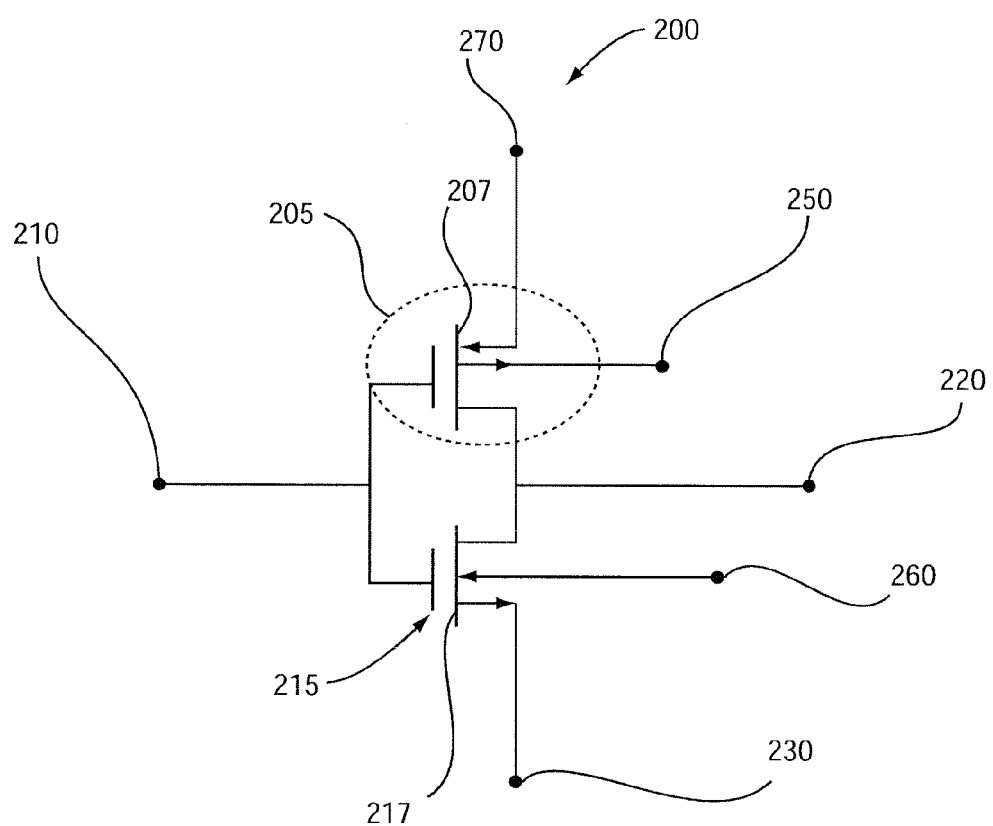
FIG. 5 is a schematic diagram of a CMOS circuit element.

Referring to FIG. 5, a CMOS logic circuit repair is described. A CMOS inverter circuit 200 includes an input pad 210, an output pad 220, a PFET N-well contact pad 250 and an NFET source pad 230. During normal CMOS operation, pad 230 is connected to Vss or ground, and pad 250 is connected to high voltage, e.g., Vdd.

Figure 6:
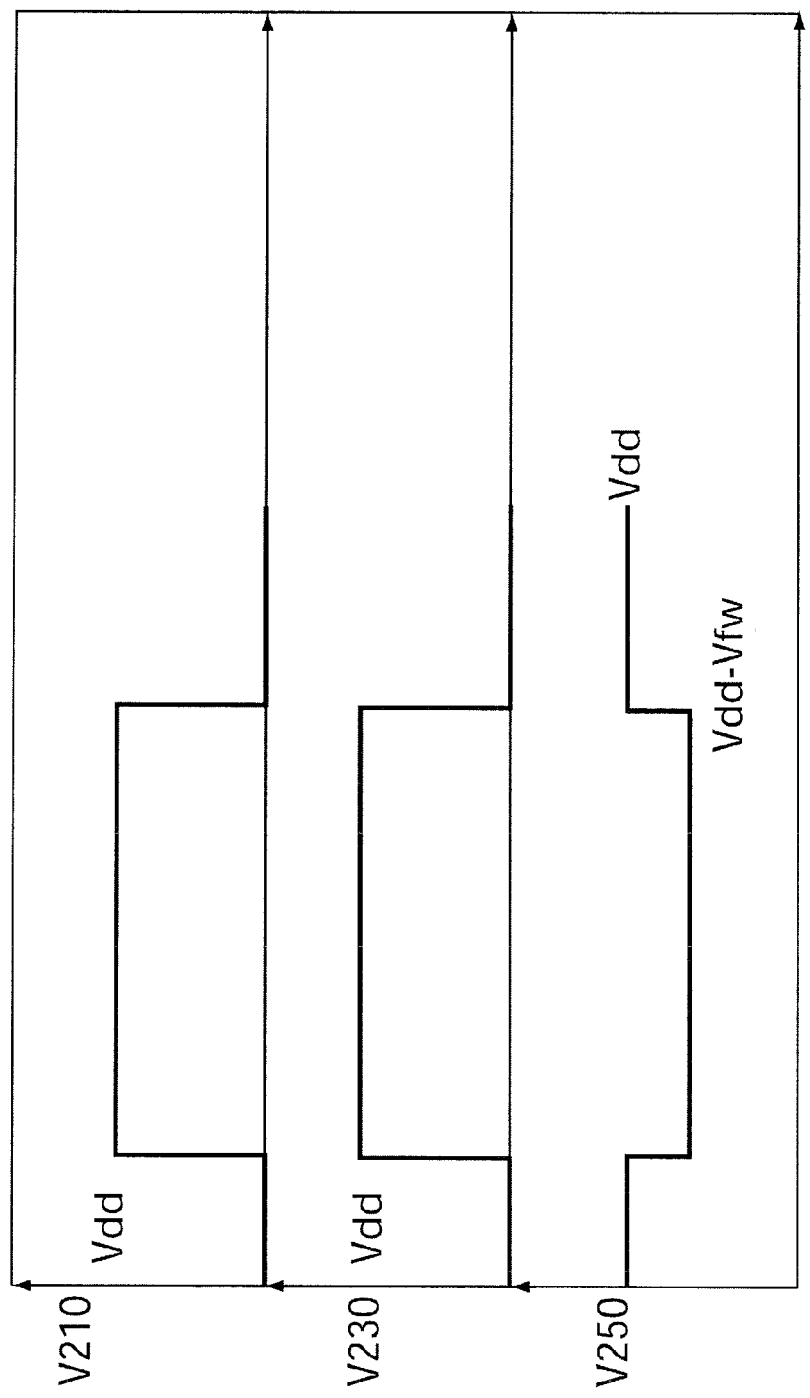
FIG. 6 is a timing diagram showing waveforms during a recovery mode in accordance with an illustrative embodiment.

Referring to FIG. 6, a timing diagram shows corresponding repair mode waveforms (voltages) at pads 210, 230 and 250 as indicated by V210, V230, and V250, respectively. In a repair mode for a PMOS device 205, input pad 210 is set high (Vdd), pad 230 is switched from Vss to Vdd, while pad 250 is biased at Vdd−Vfw (e.g., Vfw=0.7V to 0.8V). Vfw is the forward PN junction voltage, and 0.7V~0.8V is the turn-on voltage of the PN junction. In the repair mode, both PN junctions of the PFET source and drain are slightly forward biased.

In this case with continued reference to FIGS. 5 and 6, the ground line is fed with the same voltage as power supply, Vdd, so that when a gate 207 is switched from low to high, the output node 220 will also rise from low to high which is now applied to the drain of the PMOS device 205. This will make the PMOS device 205 to be efficiently fixed.

A similar repairing method can be applied for NMOS 215 by switching the NFET P-well 260 to Vfw while input 210 is kept low or 0V, and by switching pad 270 to ground while pad 230 is grounded as in normal operation. Repairing a circuit should facilitate proper bias at each node of the device so that the unwanted charge accumulated in the gate region can be eliminated.

Figure 7:
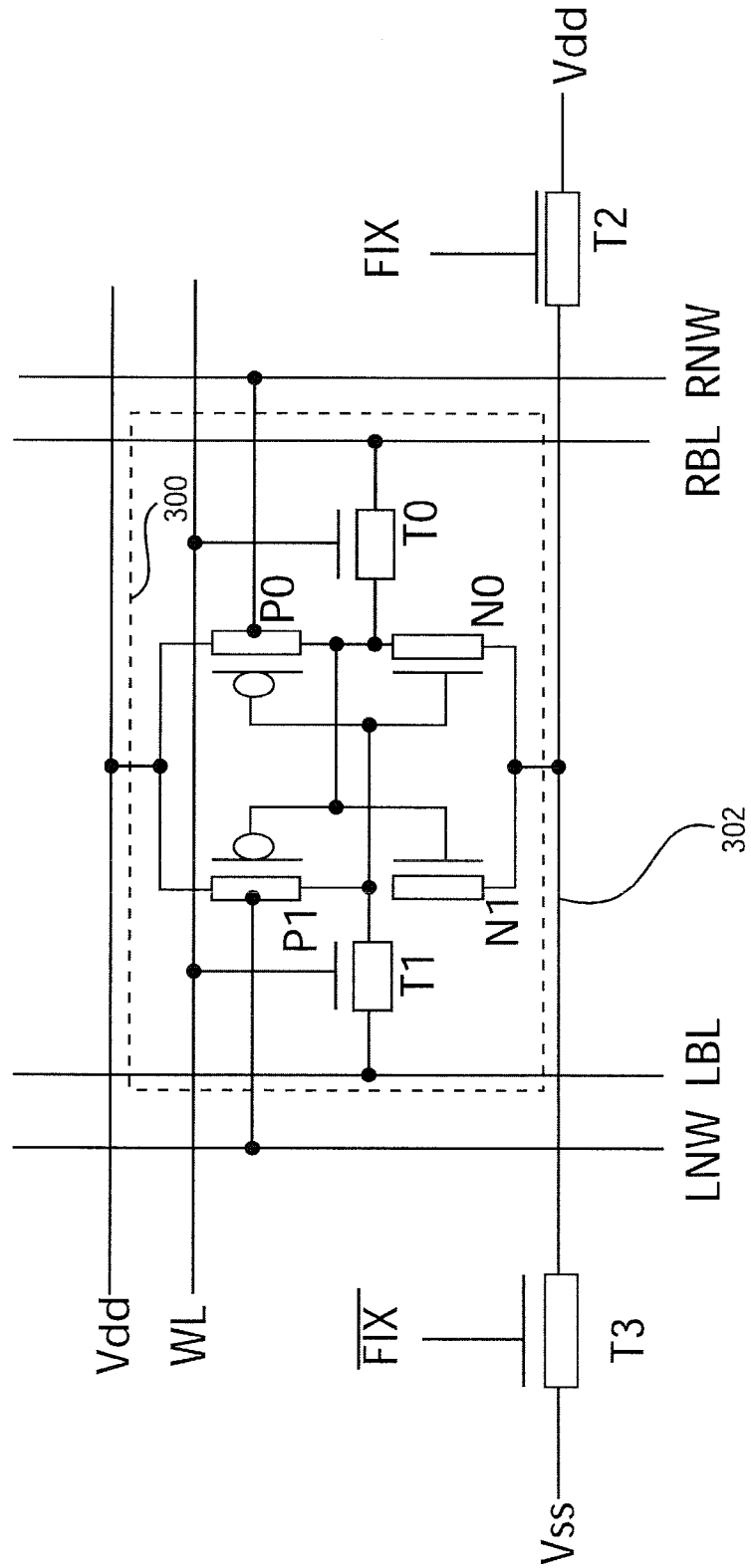
FIG. 7 is a schematic diagram showing a novel SRAM cell including SRAM structures and a repair structure in accordance with the present principles.

Referring to FIG. 7, an SRAM array repair will now be illustratively described in accordance with another embodiment. An illustrative six-transistor SRAM cell 300 includes a pair of pull-up PMOS devices, P0 and P1; a pair of pull-down NMOS devices, N0 and N1 and a pair of NMOS transfer devices, T0 and T1. Gates of the transfer devices T0 and T1 are tied to a wordline WL. Drains of each transfer device T0 and T1 are tied to a left bitline LBL and a right bitline RBL, respectively. A body of P1 is tied to left n-well contact LNW, while a body of P0 is tied to right n-well contact RNW. A power supply for the cell 300 is tied to Vdd. A ground line 302 is tied to Vss in a normal mode when not in a fix mode (or when FIX bar enables conduction through a transistor T3). The ground line 302 is tied to Vdd when is in the fix mode (or FIX enable transistor T2 to conduct). Two transfer gates T2 and T3 control the voltage on ground line 302.

The cell 300 is preferably designed to have only the pull-up PMOS devices P0 and P1 fixed after their Vt shifts exceed a predetermined level. A similar arrangement can be implemented to fix the pull down NMOS devices, N0 and N1. During the repair mode, FIX=1 which turns on T2 and turns off T3 and thus connects the ground line to Vdd. The bodies of the P0 and P1 devices are alternatively biased during the repairing period. Each time, all the left pull-up PMOS devices (in this case P1) in the array are repaired simultaneously. When this is done, all the right pull-up PMOS devices (in this case P0) are fixed subsequently by properly biasing each bitline (LBL and RBL) of the paired bitlines.

Figure 8:
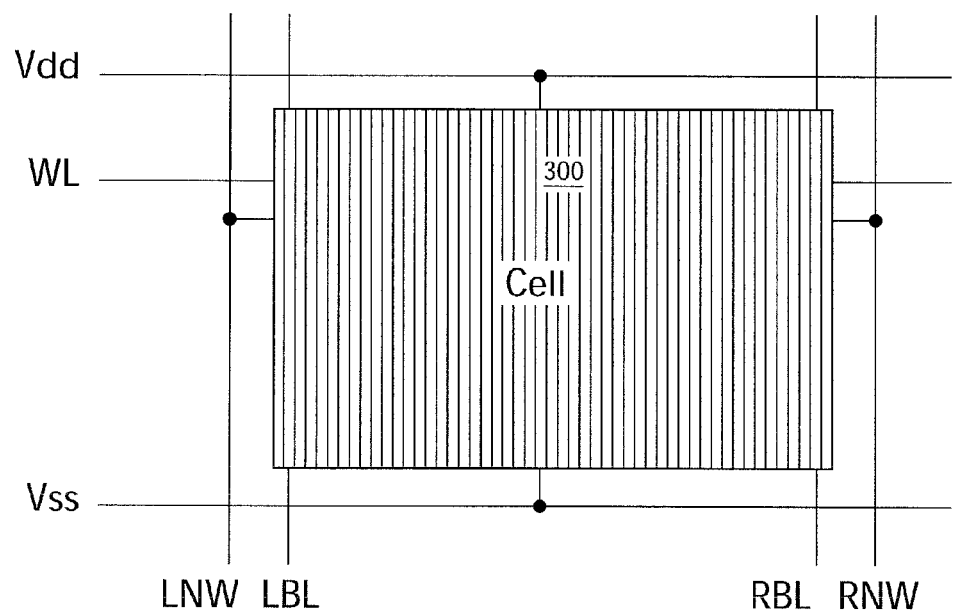
FIG. 8 is a simplified schematic view of one SRAM cell with repairing capability.

Referring to FIG. 8, a simplified SRAM cell 300 is shown, wherein the cell 300 comprises a power supply Vdd, a ground Vss, a Wordline WL, a right bitline RBL, a left bitline LBL, and two N-well contacts LNW and RNW. The cell 300 is employed for constructing a 4×4 array (402) and associated repair circuits are shown in FIG. 9.

Figure 9:
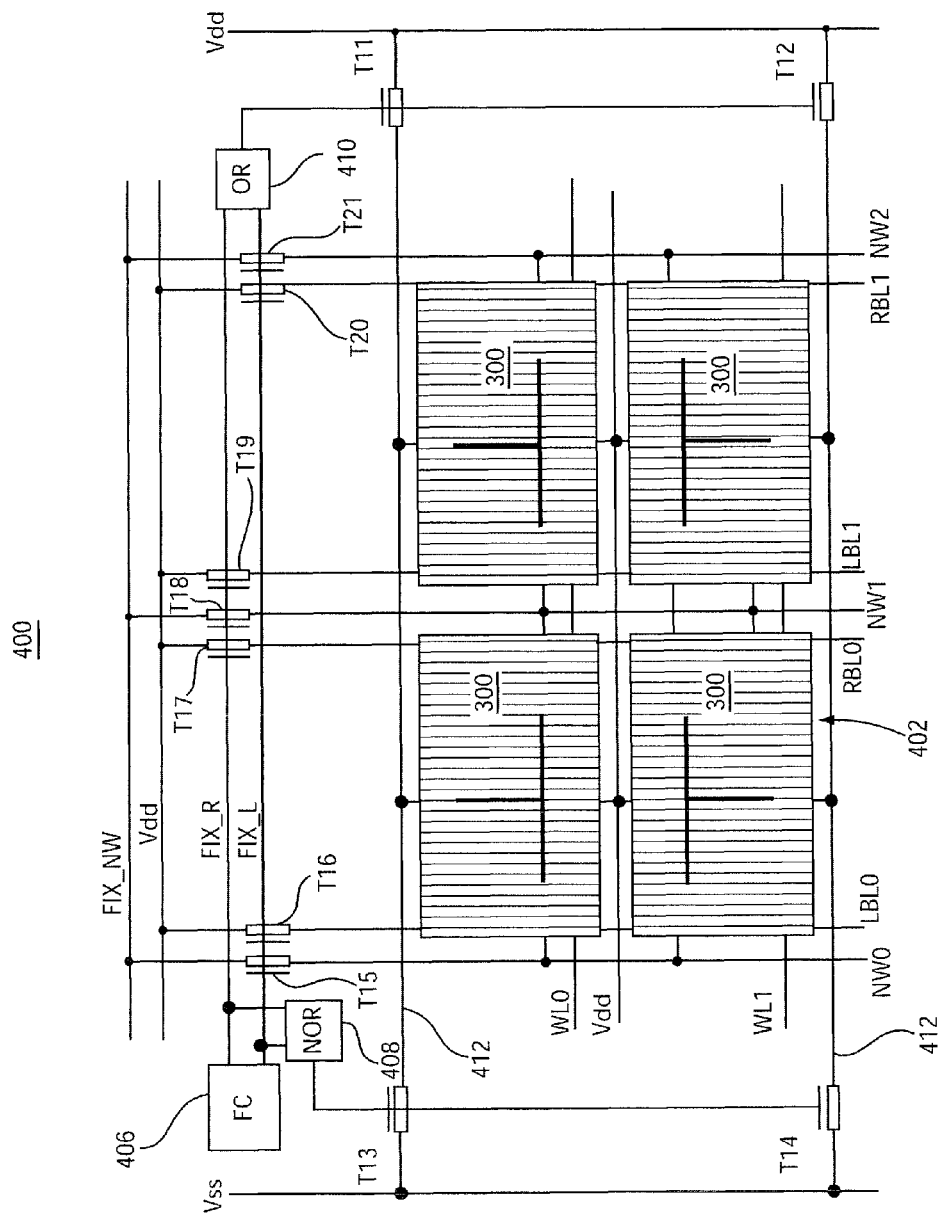
FIG. 9 is a schematic diagram of a 4×4 SRAM array employing repairing features in accordance with one illustrative embodiment.

Referring to FIG. 9, a repair circuit 400 for repairing a 4×4 array 402 of memory cells 300 is employed as an example to indicate how an SRAM array can be constructed in accordance with the present principles. The repair circuit 400 provides that pull up PMOS devices (P0 and P1, in FIG. 7) can be periodically fixed for NBTI related determination. A fix control (FC) circuit 406 is employed to generate a left side fix and right side fix signal, or FIX_L and FIX_R, respectively. These two control signals are connected to a NOR gate 408 and an OR gate 410.

When neither side fix is called, an output of the NOR gate 408 will connect a ground line(s) 412 of the SRAM array to Vss. When either side is in fix mode, the ground line(s) 412 of the SRAM array is connected to Vdd. The connection of ground lines 412 is selectively performed through transfer devices T11, T12, T13 and T14 using the outputs of the NOR gate 408 and the OR gate 410.

During left-side fix mode, the FIX_L is high, the left sides of all the cells 404 are under repair. At that time, WL lines (WL0, WL1, etc.) can be simultaneously or sequentially switched on to access each cell 404. Left side bitlines (LBL0, LBL1, etc.) and left side n-wells (NW0, NW1, NW2, etc.) are switched on via transfer devices T16, T19 and T15, T18, respectively. The left-side n-wells are tied to FIX_NW level. The left-side pull-up PMOS devices (P0, P1, shown in FIG. 7) of all the cells 404 are under repair. The repair can be performed in a fixed time or using a monitoring device (not shown) to determine when the repair is complete.

A cell could be monitored by sampling write and read operations. The failing of either operation indicates the need of repair. Alternately, a monitoring device, e.g., a separate PFET, under similar SRAM PFET conditions and operations may be employed with a threshold voltage monitoring circuit. If the PFET threshold voltage increases to a preset value, the cell repairing mode can be turned on. The threshold voltage may be compared to the preset value or determined from storage (e.g., a look-up table or the like).

When the left devices are fixed, the right side devices are repaired subsequently by employing transfer devices T17, T18, T19 and T20. These devices permit access to N-wells and right bitlines (RBL0, RBL1, etc.). Based on the same principles, numerous array arrangements may be employed to achieve the same or similar results within the scope of the present invention.

Figure 10:
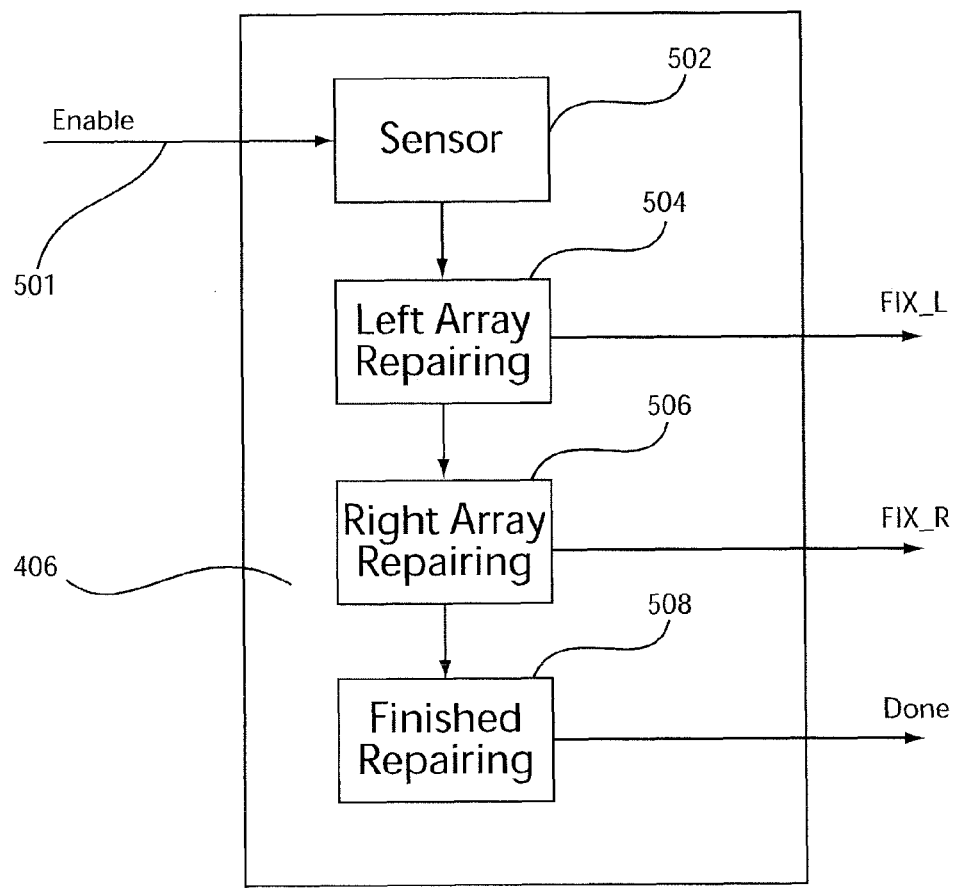
FIG. 10 is a schematic diagram showing a fix control circuit in greater detail in accordance with one illustrative embodiment.

Referring to FIG. 10, a fix control (FC) circuit 406 includes a sensor 502, wherein at least one monitor device (not shown) is provided, and a threshold level of the monitor device is compared to a reference level to determine if a repair or reset is needed for a device or devices being monitored. The monitor device is preferably under the same stress as the device or devices being monitored (e.g., the devices in the cells 404 of the SRAM array). When the threshold level exceeds that of the reference level, a fix signal is triggered by circuit 406. For example, FIX_L and/or FIX_R may be generated.

Since a fix is preferably not executed when the array is under normal operation, an enable signal 501 is provided by the system to time when it would be appropriate to repair devices. When the array is in a fix mode, the sensor 502 decides whether the array needs to be fixed or not. If a repair is needed, a trigger signal will activate a left array repair block 504 by issuing a FIX_L control signal to the array. At least one monitor device of sensor 502 may be employed to time a fix period. When the threshold level of the damaged device is recovered to a predetermined value, the fix is complete.

Then, a right array repair block 506 is activated and issues a FIX_R signal to the array. When all the devices are fixed, a finish repair block 508 ends the fix cycle and informs the system (DONE) that the array is ready for a normal function mode. It should be noted that the order in which the left or right side of the array are repaired may be switched. In one embodiment, a single fix signal may be output to test a single device or component.

Figure 11:
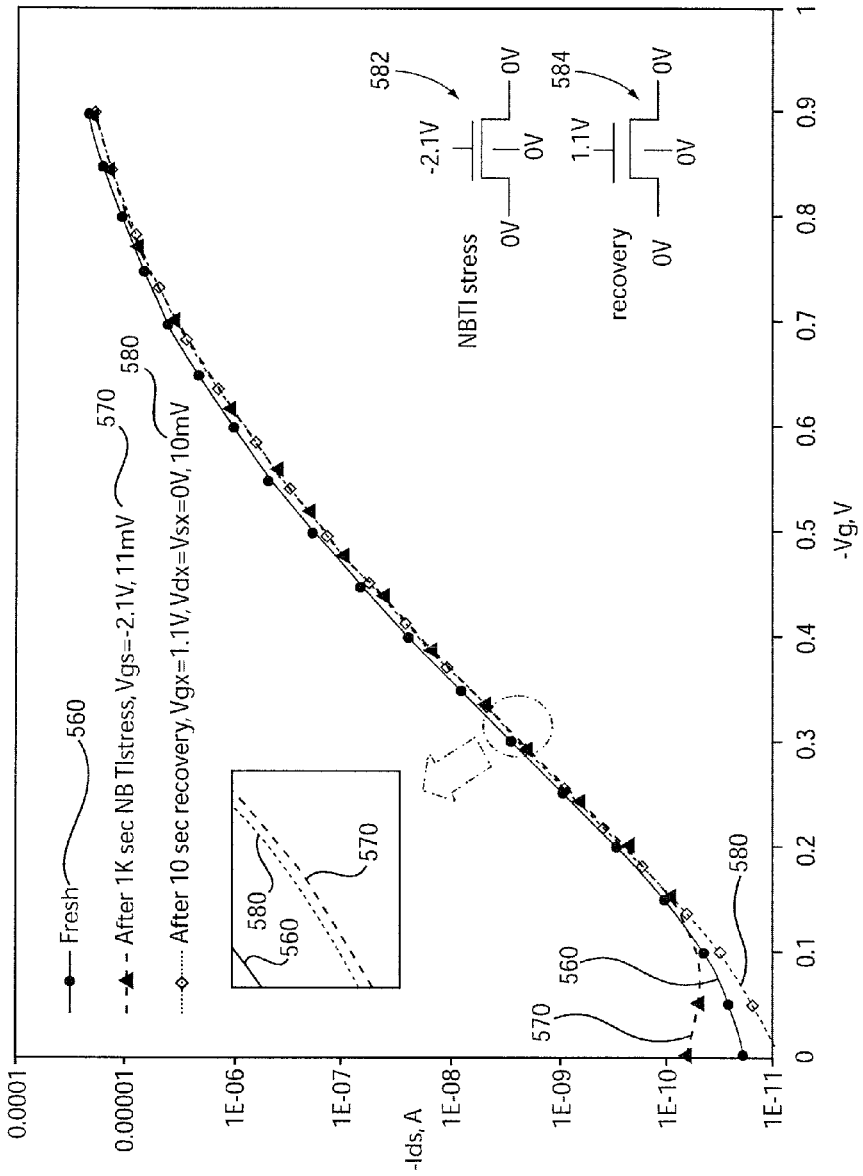
FIG. 11 shows characteristic I-V curves of a PFET device before and after NBTI stress, and after a recovery process, also depicted in the insets are transistors showing relevant voltages in accordance with the present principles for a floating body device repair.

Referring to FIG. 11, I-V curves 560, 570 and 580 are shown for a PFET on a silicon-on-insulator (SOI) substrate without body contact. Drain to source current ($I_{DS}$) in Amps is plotted against gate voltage $V_g$ in volts. The I-V curves show the PFET response before stress (as marked by curve 560), after NBTI stress (as marked by curve 570), and after the recovery process (as marked by curve 580). Observe that in curve 570, the 1000 seconds of NBTI stress, with Vgs biased at −2.1V and other nodes grounded as depicted by an inset 572, induces a threshold shift ΔVt of 11 mV. By employing CN recovery (curve 580) with gate and source/drain biased respectively at +1.1V and +0.0V as depicted by an inset 582, the threshold shift ΔVt is recovered by 10% to only 10 mV.

Figure 12:
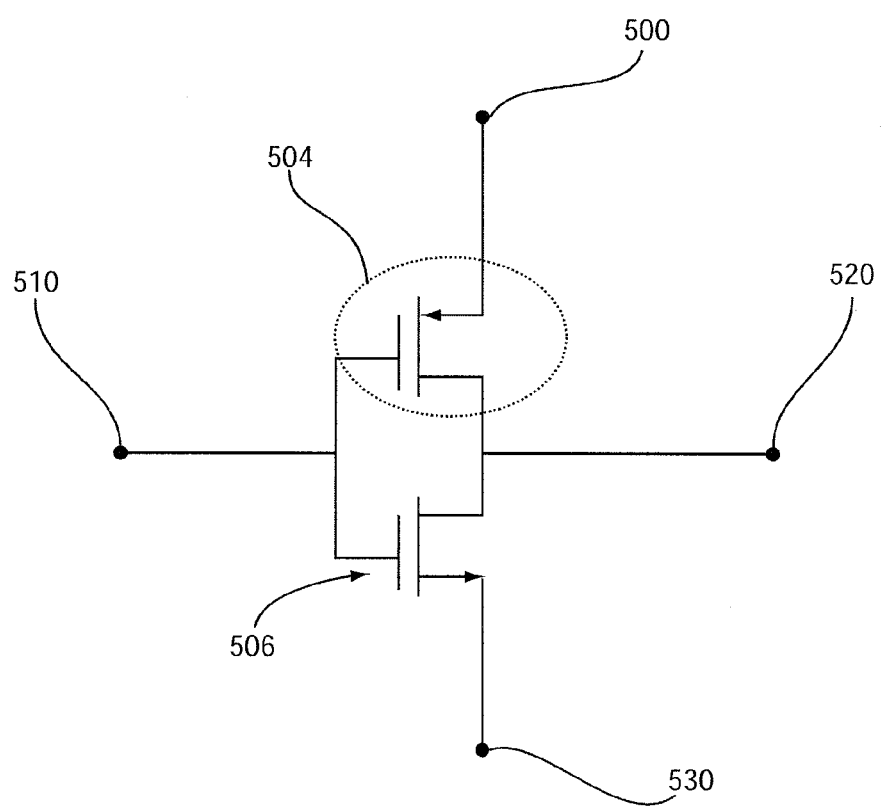
FIG. 12 is a schematic diagram of a CMOS circuit element with no body contacts.

Referring to FIG. 12, a CMOS logic circuit repair is described for a floating body SOI CMOS. A CMOS inverter circuit 502 includes an input pad 510, an output pad 520, and source pads 500 (for PFET) and 530 (for NFET). During normal CMOS operation, pad 530 is connected to Vss or ground, and pads 500 and 530 are switched between high voltage, e.g., Vdd, and ground, e.g., Vss, as indicated in FIG. 13.

A method for repairing degraded field effect transistors includes forward biasing PN junctions of one of a source and a drain of a field effect transistor (FET) and accumulating charge in a gate region to neutralize charge in the gate region. The charge is preferably accumulated by applying one of a supply voltage and a ground voltage to a source pad of the device being repaired to accumulate charge in the gate region.

Figure 13:
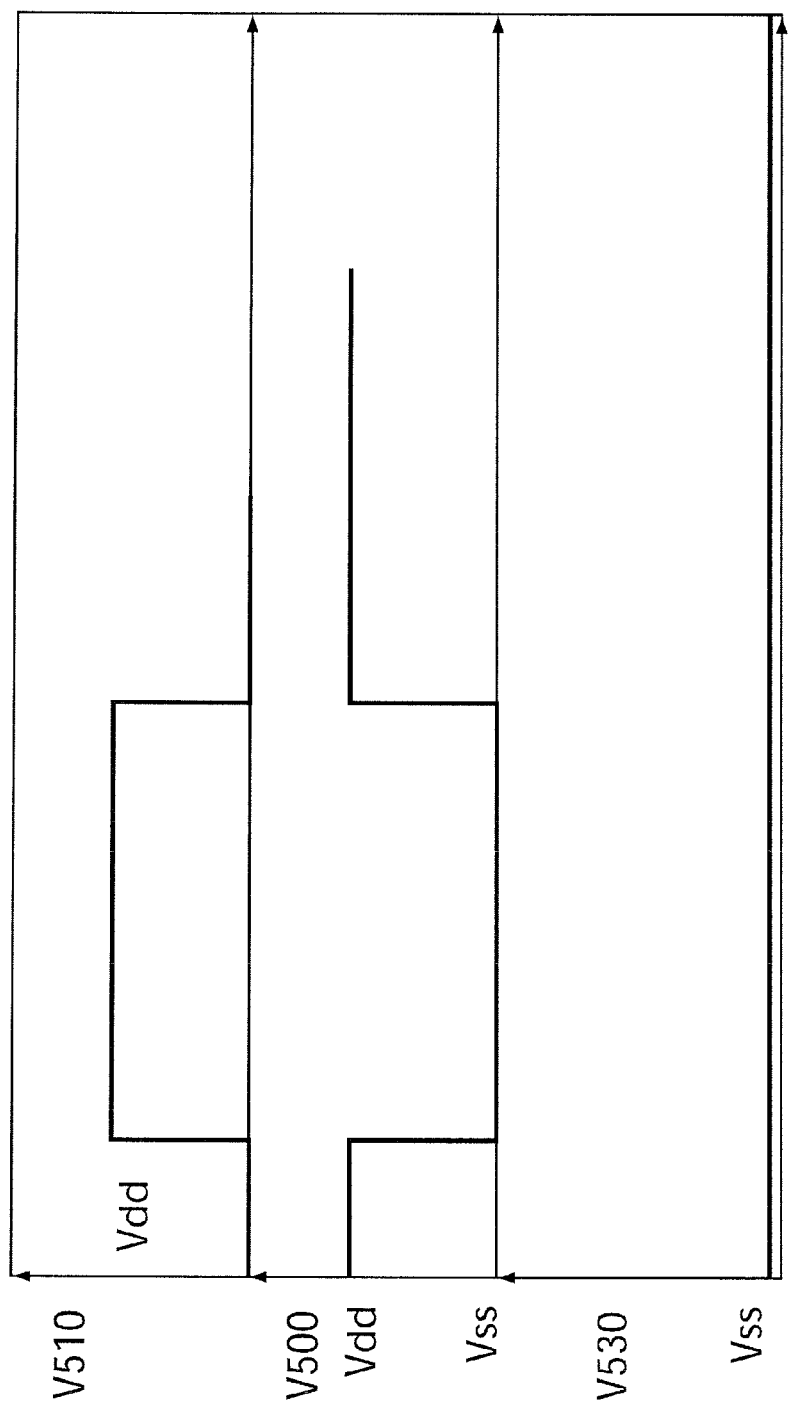
FIG. 13 is a timing diagram showing waveforms during a repair mode in accordance with an illustrative embodiment.

Referring to FIG. 13, a timing diagram shows corresponding repair mode waveforms (voltages) at pads 510, 500 and 530 as indicated by V510, V500, and V530, respectively. In a repair mode for a PMOS device 504 (FIG. 12), input pad 510 is set high (Vdd), pad 500 is switched from Vdd to Vss, while pad 530 is maintained at Vss. In the repair mode, the NBTI degraded PFET (PMOS) is biased into accumulation mode to partially recover the NBTI degradation without body contact (floating body).

A similar repairing method can be applied for NMOS 506. Repairing a circuit should facilitate proper bias at each node of the device so that the unwanted charge accumulated in the gate region can be neutralized.

Figure 14:
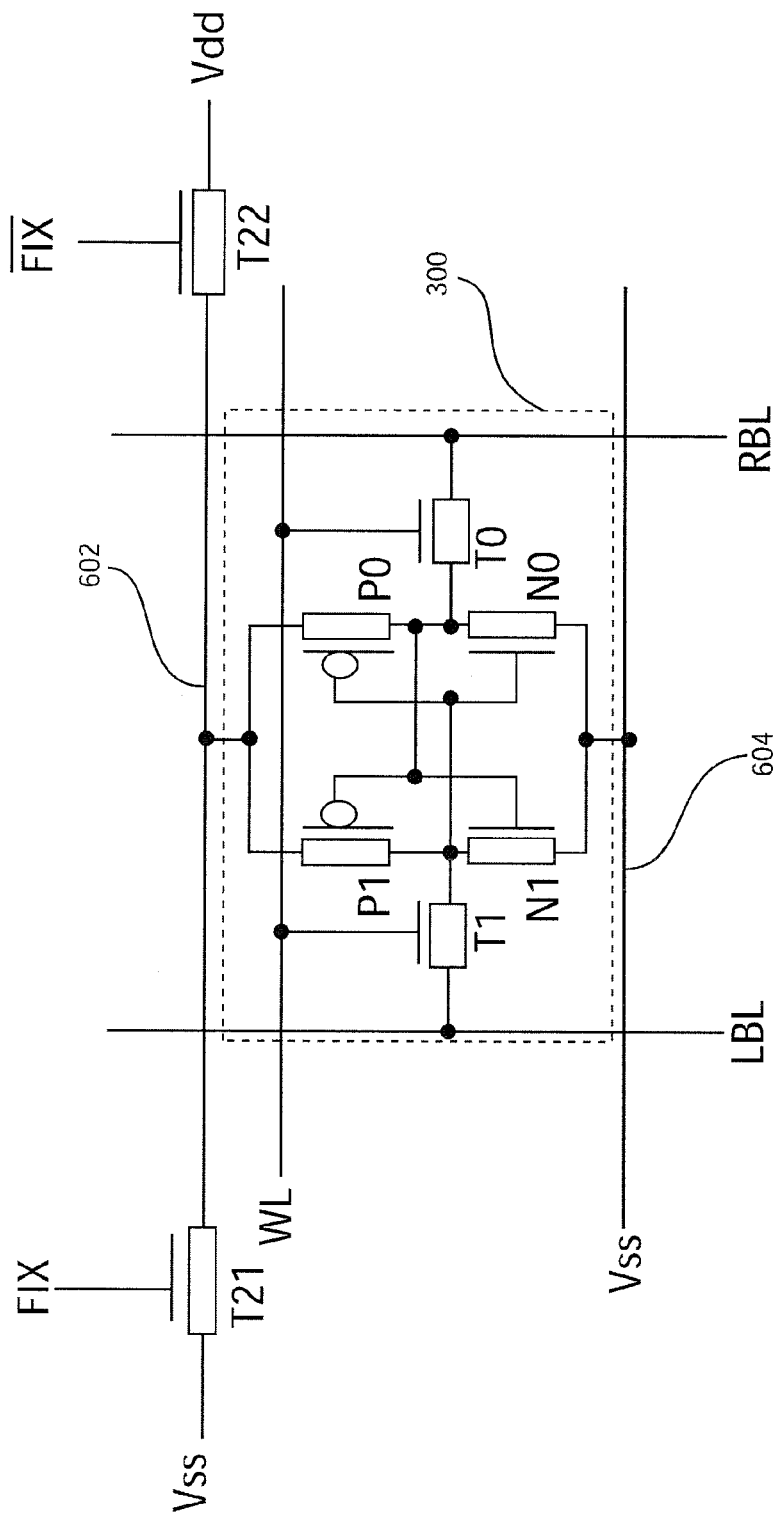
FIG. 14 is a schematic diagram showing a novel SRAM cell including SRAM structures and a repair structure for a device without body contacts in accordance with the present principles.

Referring to FIG. 14, an SRAM array repair will now be illustratively described in accordance with the floating body embodiment. An illustrative six-transistor SRAM cell 300 includes a pair of pull-up PMOS devices, P0 and P1; a pair of pull-down NMOS devices, N0 and N1 and a pair of NMOS transfer devices, T0 and T1. Gates of the transfer devices T0 and T1 are tied to a wordline WL. Drains of each transfer device T0 and T1 are tied to a left bitline LBL and a right bitline RBL, respectively.

A power supply 602 for the cell 300 is tied to Vdd and Vss using transistors T21 and T22, respectively. A ground line 604 is tied to Vss. In a fix mode, a FIX signal or FIX bar signal appropriately ties the power line 602 to Vss or Vdd by enabling conduction through transistor T21 or T22.

The pull-up PMOS devices P0 and P1 are fixed after their Vt shifts exceed a predetermined level. A similar arrangement can be implemented to fix the pull down NMOS devices, N0 and N1. During the repair mode, T22 is turned on and turns off T21 to create the situation depicted in FIG. 13 for P0 and P1. The bodies of the P0 and P1 devices are floating in this embodiment during the repair period. Each time, all the left pull-up PMOS devices (in this case P1) in the array are repaired simultaneously. When this is done, all the right pull-up PMOS devices (in this case P0) are fixed subsequently by properly biasing each bitline (LBL and RBL) of the paired bitlines.

Having described preferred embodiments of self-repair integrated circuits, devices and repair methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for repairing field effect transistors in a memory circuit having an array of memory cells, comprising:

for pull-up P-type devices, switching a ground line from a ground potential to a supply potential;

switching on all wordlines in the array;

repairing P-type devices on a first side by connecting an n-well of the P-type devices to a voltage less than the supply potential, but greater than the ground potential;

activating bitlines on the first side;

repairing P-type devices on a second side by connecting the n-well of the P-type devices to the voltage less than the supply potential, but greater than the ground potential; and activating bitlines on the second side.

2. The method as recited in claim 1, wherein the supply potential is Vdd and the voltage less than the supply potential, but greater than the ground potential is Vdd−Vfw, where Vfw is a forward bias voltage.

3. The method as recited in claim 1, further comprising triggering a fix mode when a threshold voltage exceeds a reference level in at least one device to be repaired.

4. The method as recited in claim 3, further comprising generating at least one control signal to initiate device repairs.

5. The method as recited in claim 3, further comprising resuming normal operation when all repairs have been performed.

6. The method as recited in claim 1, further comprising triggering a fix mode when any one of write and read operations fails.

* * * * *